United States Patent
Hwang et al.

(10) Patent No.: US 9,143,094 B2
(45) Date of Patent: Sep. 22, 2015

(54) MICROWAVE POWER AMPLIFICATION APPARATUS AND METHOD THEREOF

(71) Applicant: NATIONAL CHENG KUNG UNIVERSITY, Tainan (TW)

(72) Inventors: Sheng-Kwang Hwang, Tainan (TW); Yu-Han Hung, Chiayi (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 0 days.

(21) Appl. No.: 14/469,166

(22) Filed: Aug. 26, 2014

(65) Prior Publication Data

US 2015/0244331 A1    Aug. 27, 2015

(30) Foreign Application Priority Data

Feb. 27, 2014  (TW) .............................. 103106710 A

(51) Int. Cl.
| | |
|---|---|
| H01S 3/00 | (2006.01) |
| H03F 3/08 | (2006.01) |
| H03F 3/21 | (2006.01) |
| H01S 5/062 | (2006.01) |
| G02F 1/35 | (2006.01) |

(52) U.S. Cl.
CPC .. *H03F 3/08* (2013.01); *H03F 3/21* (2013.01); *G02F 1/3538* (2013.01); *H01S 5/0623* (2013.01); *H03F 2200/393* (2013.01)

(58) Field of Classification Search
CPC . H01S 5/4006; H01S 5/06213; H01S 5/0623; G02F 1/3538
USPC .............................................. 372/20; 359/333
See application file for complete search history.

(56) References Cited

U.S. PATENT DOCUMENTS

| | | | | |
|---|---|---|---|---|
| 6,813,288 | B2 * | 11/2004 | Kim et al. | ........................ 372/20 |
| 2012/0002972 | A1 * | 1/2012 | Stiffler et al. | ................. 398/115 |
| 2013/0188962 | A1 * | 7/2013 | Middleton et al. | ............ 398/116 |

FOREIGN PATENT DOCUMENTS

| | | |
|---|---|---|
| CN | 101499855 | 8/2009 |
| CN | 101793920 | 8/2010 |
| CN | 102545042 | 7/2012 |
| CN | 103344194 | 10/2013 |

OTHER PUBLICATIONS

Chan, Sze-Chun, "Analysis of an Optically Injected Semiconductor Laser for Microwave Generation", IEEE Journal of Quantum Electronics, Mar. 2010, pp. 421-428, vol. 46, No. 3.
Simpson et al., "Nonlinear Dynamics Induced by External Optical Injection in Semiconductor Lasers", Quantum Semiclass. Opt., 1997, pp. 765-784, vol. 9.

* cited by examiner

*Primary Examiner* — Mark Hellner
(74) *Attorney, Agent, or Firm* — Muncy, Geissler, Olds & Lowe, P.C.

(57) ABSTRACT

Period-one nonlinear dynamics of semiconductor lasers are utilized to provide an apparatus for photonic microwave power amplification in radio-over-fiber links through optical modulation depth improvement. The microwave power amplification apparatus includes a microwave-modulated optical signal generation module and a microwave power amplification module. The amplification capability of the present microwave power amplification apparatus covers a broad microwave range, from less than 25 GHz to more than 60 GHz, and a wide gain range, from less than 10 dB to more than 30 dB. The microwave phase quality is mainly preserved while the microwave power is largely amplified, improving the signal-to-noise ratio up to at least 25 dB. The bit-error ratio at 1.25 Gb/s is better than $10^{-9}$ and a sensitivity improvement of up to at least 15 dB is feasible.

12 Claims, 13 Drawing Sheets

MICROWAVE POWER AMPLIFICATION APPARATUS AND METHOD THEREOF

CROSS-REFERENCE TO RELATED APPLICATION

This application claims priority from Taiwan Patent Application No. 103106710, filed on Feb. 27, 2014 in Taiwan intellectual Property Office, the contents of which are hereby incorporated by reference in their entirety.

BACKGROUND OF THE INVENTION

1. Field of the Invention

The present invention relates to a microwave power amplification apparatus and method thereof by using, particularly, period-one nonlinear dynamics of semiconductor lasers.

2. Description of the Related Art

Communication networks are generally classified into wireless networks and wireline networks. In the wireless networks, microwaves are used as carriers to deliver data through air to provide communication between mobile electronic devices. In the wireline networks based on optical technologies, optical waves function as carriers to deliver data through optical fibers to provide communication between immobilized electronic devices. These two networks depend on completely different communication approaches and cover completely different communication scopes. Due to the rapid advances of broadband wireless technologies and also due to the various developments of online applications, the capacity demand for data transmission in the wireless networks increases considerably. If the wireless networks are required to manage both the front-end data transmission between users and wireless base stations and the back-end data transmission between the wireless base stations and central offices, currently developed broadband wireless technologies are not capable of meeting the vast capacity demand for data transmission when the wireless networks are simultaneously accessed by a variety of different users or devices.

Since each channel of the wireline networks based on optical technologies provides data transmission capacity of the order of a few Gbits/s to tens of Gbits/s, the optical communication networks are highly suitable to work as backbones for huge back-end data transmission for various network applications. Therefore, radio-over-fiber (RoF) networks which integrate the wireless networks (responsible for the front-end data transmission) and the optical wireline networks (responsible for the back-end data transmission) have become very attractive for the next generation of communication technology and system.

To ensure the communication quality in the RoF networks, the power of the microwaves needs to be high enough. Three approaches are commonly adopted to increase the microwave power. In the first approach, electronic microwave amplifiers are used after photo-detection at base stations. However, to fulfill the demand of considerably increasing data transmission in the future, significantly more data bandwidth is necessary. This therefore requires continuous upgrade or replacement of the electronic microwave amplifiers with higher bandwidth capability, suggesting an enhancement of operation cost. In the second approach, optical power amplifiers are used before photo-detection to increase the power of the input optical signals upon photodetectors. However, too much of the input optical power would damage the photodetectors. In the third approach, the optical modulation depth of the input optical signals is increased, which in turn increases the microwave power after photo-detection under the same received optical power. This can be achieved by increasing the microwave power when directly or externally modulating semiconductor lasers. However, nonlinear effects, such as harmonic or intermodulation distortion, are generally induced, which affect the quality of the received signals. In addition, under the same received optical power at the photodetectors, the optical modulation depth can be increased by reducing the power difference between the optical modulation sidebands and the optical carrier, which is commonly quantified by the sideband-to-carrier ratio (SCR). Currently, the optical filtering scheme is applied to achieve a better SCR value by suppressing the power of the optical carrier while maintaining that of the optical modulation sidebands. This, however, considerably reduces the overall power of the optical signal and therefore requires extra optical power amplifiers to compensate for the power loss.

SUMMARY OF THE INVENTION

According to the problems and challenges encountered in prior arts, the purpose of the present invention is to provide an apparatus for microwave power amplification in the RoF networks through optical modulation depth improvement by applying period-one nonlinear dynamics of semiconductor lasers. The microwave power amplification apparatus of the present invention includes a semiconductor laser as the key component, which can be reconfigured for different communication networks with different requirements or different applications adopting different microwave frequencies.

Another purpose of the present invention is to provide a method for microwave power amplification in the RoF networks through optical modulation depth improvement by applying period-one nonlinear dynamics of semiconductor lasers. In this manner, similar and even improved microwave quality and bit-error ratio (BER) are obtained, which shall enhance the signal detection sensitivity of communication networks, the transmission distance of optical fibers, and the network transmission efficiency.

According to the aforementioned purposes, the present invention provides a microwave power amplification apparatus to amplify power of microwaves in the RoF networks. The microwave power amplification apparatus includes a microwave power amplification module. While the optical input of the microwave power amplification module is an optical signal carrying a power-to-be-amplified microwave signal and has at least one modulation sideband, the optical output of the microwave power amplification module is an optical signal carrying a power-amplified microwave signal. The microwave power amplification module includes a microwave-power amplification laser, which converts the optical input into the optical output using period-one nonlinear dynamics of the microwave-power amplification laser, wherein the optical input falls within the domain for microwave power amplification using the period-one nonlinear dynamics of the microwave-power amplification laser.

Preferably, the microwave power amplification apparatus further includes a microwave-modulated optical signal generation module to generate the optical input. The microwave-modulated optical signal generation module includes a laser to generate a continuous-wave optical signal, an optical polarization controller to adjust the polarization of the continuous-wave optical signal, a microwave signal generator to generate the power-to-be-amplified microwave signal, and an external modulator to superimpose the power-to-be-amplified microwave signal on the continuous-wave optical signal to generate the optical input.

Preferably, the microwave-modulated optical signal generation module further includes a data signal generator to generate a data signal to be transmitted, which can be an analog signal or a digital signal, and an electrical signal mixer to mix power-to-be-amplified microwave signal with the data signal to generate a power-to-be-amplified microwave signal carrying the data signal.

Preferably, the microwave power amplification module further includes an optical power adjuster and an optical polarization controller. The optical power adjuster includes an active optical device or a passive optical device to adjust the optical power of the optical input, and the optical polarization controller adjusts the polarization of the optical input.

Preferably, the active optical device is an optical power amplifier and the passive optical device is an optical power attenuator.

Preferably, the microwave power amplification module may include an optical path controller, connected to the microwave-power amplification laser, to unidirectionally direct the optical input toward the microwave-power amplification laser, and to unidirectionally direct the optical output toward an output port of the microwave power amplification apparatus.

Preferably, the optical path controller is an optical circulator and the microwave-power amplification laser is a semiconductor laser.

According to the aforementioned purposes, the present invention further provides a microwave power amplification method to amplify power of microwaves in the RoF networks. The microwave power amplification method includes the following steps:

(1) using a microwave-modulated optical signal generation module to generate an optical input, wherein the optical input is an optical signal carrying a power-to-be-amplified microwave signal and the optical input has at least one modulation sideband, and (2) using a microwave-power amplification laser to convert the optical input into an optical output using period-one nonlinear dynamics of the microwave-power amplification laser, wherein the optical output is an optical signal carrying a power-amplified microwave signal and the optical input falls within the domain for microwave power amplification using the period-one nonlinear dynamics of the microwave-power amplification laser.

Furthermore, the step of using the microwave-modulated optical signal generation module to generate the optical input further includes the following steps:

(1) using a laser to generate a continuous-wave optical signal,
(2) using an optical polarization controller to adjust the polarization of the continuous-wave optical signal,
(3) using a microwave signal generator to generate the power-to-be-amplified microwave signal,
(4) using a data signal generator to generate a data signal to be transmitted, and the data signal being either an analog signal or a digital signal,
(5) using an electrical signal mixer to mix the power-to-be-amplified microwave signal with the data signal to generate a power-to-be-amplified microwave signal carrying the data signal, and
(6) using an external modulator to superimpose the power-to-be-amplified microwave signal on the continuous-wave optical signal to generate the optical input.

Furthermore, two more steps are also included between the step of using the microwave-modulated optical signal generation module to generate the optical input and the step of using the microwave-power amplification laser to convert the optical input into the optical output:

(1) using an optical power adjuster to adjust the optical power of the optical input, and
(2) using an optical polarization controller to adjust the polarization of the optical input.

Furthermore, in the step of using the microwave-power amplification laser to convert the optical input into the optical output, an optical path controller is also used to unidirectionally direct the optical input toward the microwave-power amplification laser, and to unidirectionally direct the optical output toward an output port.

As mentioned above, the microwave power amplification apparatus and method based upon the present invention possess one or more of the following characteristics and advantages:

(1) While maintaining the power of the optical carrier, the microwave power amplification apparatus and method of the present invention are able to increase the power of the optical modulation sidebands, which therefore reduces the power difference between the optical carrier and the optical modulation sidebands. Since the power level of the optical output is similarly maintained or even enhanced compared with that of the optical input, no extra optical power amplifier is necessary for power loss compensation.

(2) The microwave power amplification apparatus can be reconfigured for different communication networks with different requirements or different applications adopting different microwave frequencies. In addition, the apparatus is insensitive to the ambiance temperature and can self-adapt to the adjustment of the operating conditions of the communication networks, leading to a considerably stable operation of the apparatus. Therefore, the microwave power amplification apparatus of the present invention has the advantages of simple structure, stable operation, and low installation and maintenance cost.

(3) By using the period-one nonlinear dynamics of semiconductor lasers, the microwave power amplification method of the present invention provides an approach to amplify microwave power through the improvement of the optical modulation depth in the RoF networks or even other applications. In this manner, similar and even improved microwave quality and bit-error ratio (BER) are obtained, which shall enhance the signal detection sensitivity of communication networks, the transmission distance of optical fibers, and the network transmission efficiency.

The aforementioned purposes, characteristics, and advantages of the present invention are more fully described with preferred embodiments and drawings as follows.

BRIEF DESCRIPTION OF THE DRAWINGS

The device structure, operating principle, and advantageous characteristics of the present invention are described with more details hereinafter with reference to the accompanying drawings that show various embodiments of the present invention as follows.

DETAILED DESCRIPTION OF THE PREFERRED EMBODIMENTS

To illustrate the device structure, operating principle, and advantageous characteristics of the present invention, a preferred embodiment and the corresponding drawings are provided with more details. The purpose of the drawings being used is for illustration, and they are not necessarily the real proportion and precise allocation of the embodiments of the present invention. Therefore, they should not be used to limit the privilege coverage of the practical embodiments of the present invention.

Figure 1:
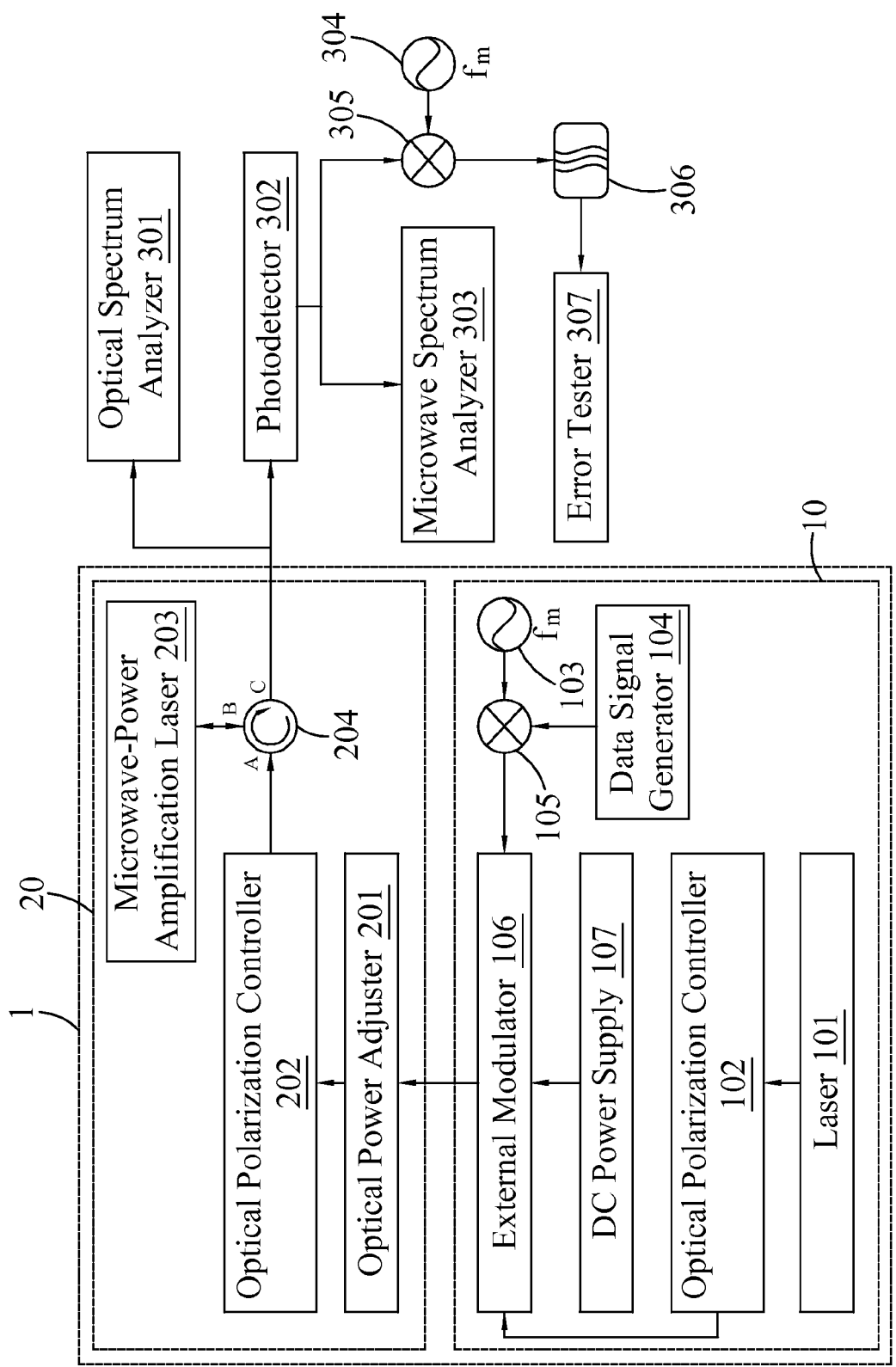
FIG. 1 is a schematic representation of a microwave power amplification apparatus according to a preferred embodiment of the present invention.

Referring to FIG. 1, FIG. 1 is a schematic representation of a microwave power amplification apparatus according to a preferred embodiment of the present invention. In FIG. 1, a microwave power amplification apparatus 1 includes a microwave power amplification module 20. The optical input of the microwave power amplification module 20 is an optical signal carrying a power-to-be amplified microwave signal and has at least one modulation sideband. The microwave power amplification module 20 includes a microwave-power amplification laser 203, which converts the optical input into an optical output carrying a power-amplified microwave signal using the period-one nonlinear dynamics. The optical input falls within the domain for microwave power amplification using the period-one nonlinear dynamics of the microwave-power amplification laser 203.

Moreover, the microwave power amplification apparatus 1 further includes a microwave-modulated optical signal generation module 10 to generate the optical input. The microwave-modulated optical signal generation module 10 includes a laser 101 to generate a continuous-wave optical signal, an optical polarization controller 102 to adjust the polarization of the continuous-wave optical signal, a microwave signal generator 103 to generate the power-to-be-amplified microwave signal, and an external modulator 106 to superimpose the power-to-be-amplified microwave signal on the continuous-wave optical signal to generate the optical input.

Moreover, the microwave-modulated optical signal generation module 10 further includes a data signal generator 104 to generate a data signal to be transmitted, which can be an analog signal or a digital signal, and an electrical signal mixer 105 to mix the power-to-be-amplified microwave signal with the data signal to generate a power-to-be-amplified microwave signal carrying the data signal.

Moreover, the microwave-modulated optical signal generation module 10 further includes a DC power supply 107 to supply a constant bias voltage to the external modulator 106.

Moreover, the microwave power amplification module 20 further includes an optical power adjuster 201 and an optical polarization controller 202. The optical power adjuster 201 includes an active optical device or a passive optical device to adjust the optical power of the optical input, and the optical polarization controller 202 adjusts the polarization of the optical input.

Moreover, the active optical device is an optical power amplifier and the passive optical device is an optical power attenuator.

Moreover, the microwave power amplification module 20 further includes an optical path controller 204, connected to the microwave-power amplification laser 203, to unidirectionally direct the optical input toward the microwave-power amplification laser 203, and to unidirectionally direct the optical output toward an output port of the microwave power amplification apparatus 1.

Moreover, the optical path controller 204 is an optical circulator and the microwave-power amplification laser 203 is a semiconductor laser.

To detect and analyze the optical input and the optical output of the microwave power amplification apparatus 1, the following devices are used:

(1) an optical spectrum analyzer 301 to analyze spectral features of the optical input or the optical output, (2) a photodetector 302 to retrieve the power-to-be-amplified microwave signal from the optical input or to retrieve the power-amplified microwave signal from the optical output, (3) a microwave spectrum analyzer 303 to analyze spectral features of the power-to-be amplified microwave signal retrieved from the optical input or the power-amplified microwave signal retrieved from the optical output, (4) a microwave signal generator 304 to generate a microwave signal of the same frequency as the power-to-be-amplified microwave signal generated by the microwave signal generator 103, (5) an electrical signal mixer 305 to mix the power-to-be amplified microwave signal retrieved from the optical input or the power-amplified microwave signal retrieved from the optical output with the microwave signal generated by the microwave signal generator 304 in order to down-convert the input data signal or the output data signal, (6) a low-pass filter 306 to filter out unnecessary high-frequency components of the input data signal or the output data signal, and (7) an error tester 307 to compare the output data signal with the input data signal in order to calculate the bit-error ratio.

For RoF networks, the aforementioned photodetector 302 can be installed within a wireless base station to retrieve data-encoded microwave signals carried by the optical input through fiber transmission.

Figure 2:
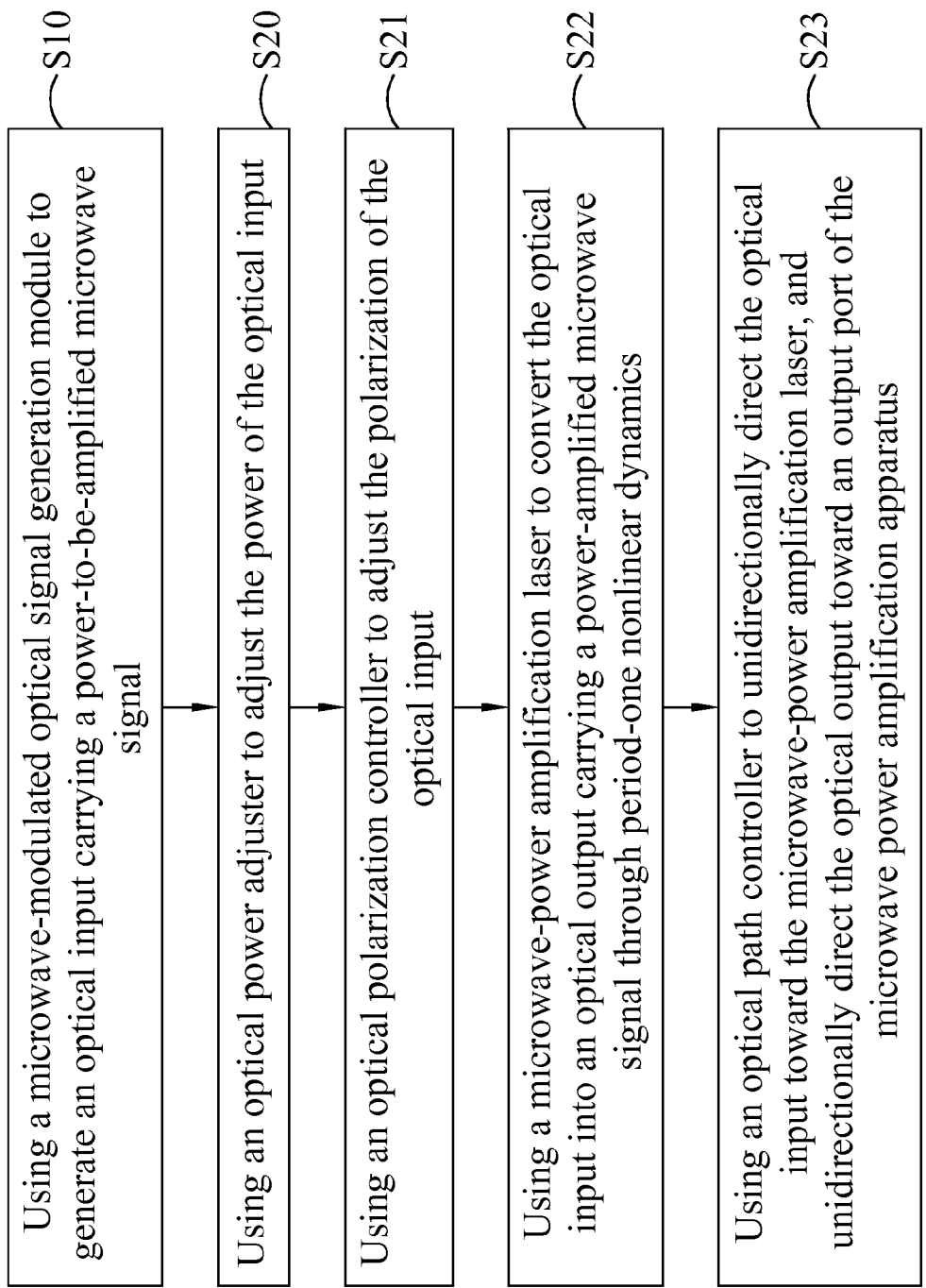
FIG. 2 is a first flow diagram showing a microwave power amplification method according a preferred embodiment of the present invention.

Referring to FIG. 2, FIG. 2 is a first flow diagram showing a microwave power amplification method according a preferred embodiment of the present invention. The microwave power amplification method of the present invention includes the following steps:

(S10): Using a microwave-modulated optical signal generation module 10 to generate an optical input carrying a power-to-be-amplified microwave signal;

(S20) Using an optical power adjuster 201 to adjust the power of the optical input;

(S21): Using an optical polarization controller 202 to adjust the polarization of the optical input;

(S22): Using a microwave-power amplification laser 203 to convert the optical input into an optical output carrying a power-amplified microwave signal through period-one nonlinear dynamics; and (S23): Using an optical path controller 204 to unidirectionally direct the optical input toward the microwave-power amplification laser 203, and unidirectionally direct the optical output toward an output port of the microwave power amplification apparatus 1.

Figure 3:
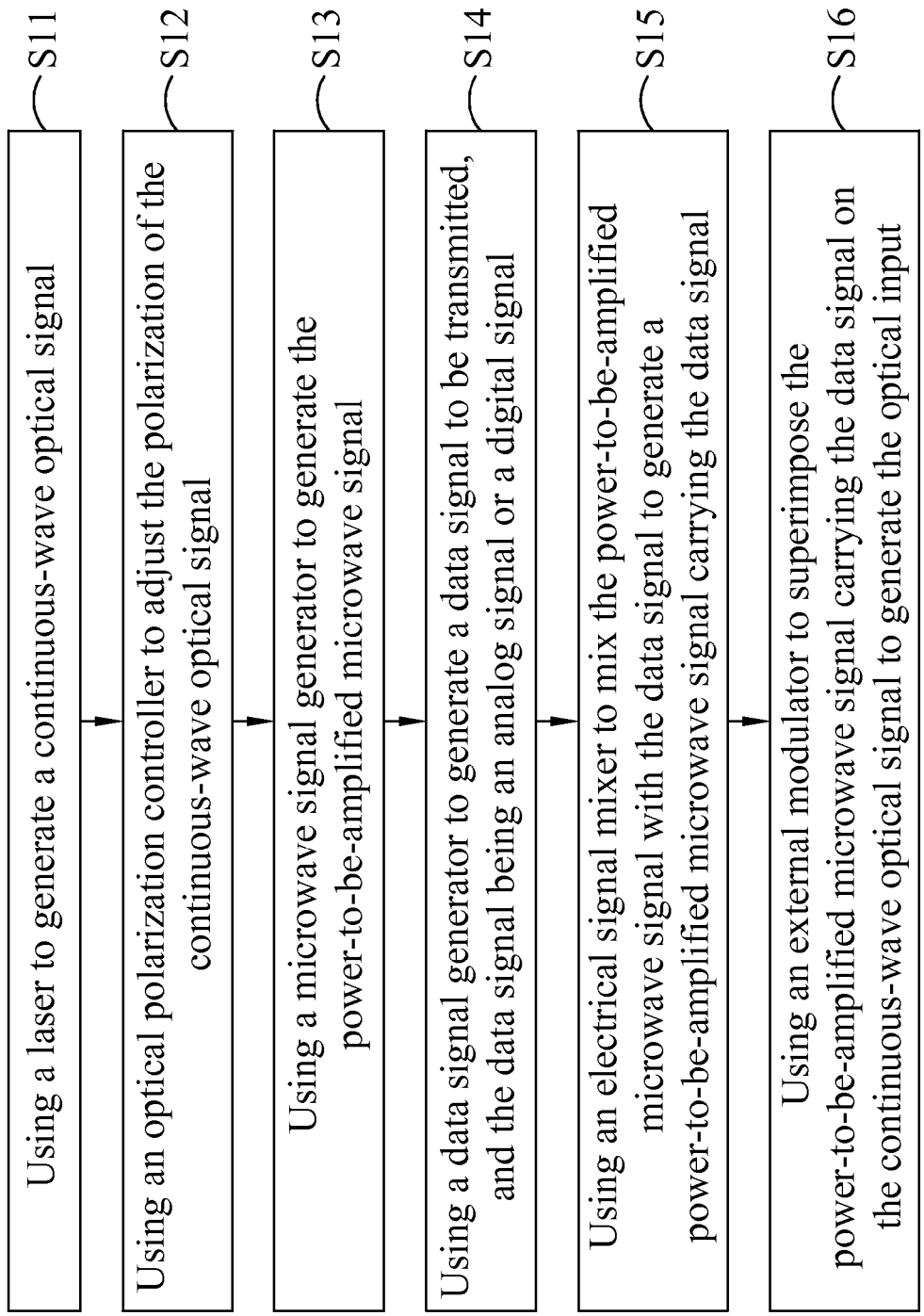
FIG. 3 is a second flow diagram showing the microwave power amplification method according to the preferred embodiment of the present invention.

Referring to FIG. 3, FIG. 3 is a second flow diagram showing the microwave power amplification method according to the preferred embodiment of the present invention. The step of S10 further comprises the following steps:

(S11): Using a laser 101 to generate a continuous-wave optical signal;

(S12): Using an optical polarization controller 102 to adjust the polarization of the continuous-wave optical signal;

(S13): Using a microwave signal generator 103 to generate the power-to-be-amplified microwave signal;

(S14): Using a data signal generator 104 to generate a data signal to be transmitted, and the data signal being an analog signal or a digital signal;

(S15): Using an electrical signal mixer 105 to mix the power-to-be-amplified microwave signal with the data signal to generate a power-to-be-amplified microwave signal carrying the data signal; and (S16): Using an external modulator 106 to superimpose the power-to-be-amplified microwave signal carrying the data signal on the continuous-wave optical signal to generate the optical input.

Based on the above description, the microwave power amplification apparatus of the present invention includes a microwave-power amplification laser, which is a semiconductor laser. Without any external perturbation, the typical output of the microwave-power amplification laser is a continuous wave of one single frequency. Under proper conditions of the injection level and frequency and without any microwave modulation, injecting the continuous-wave optical signal generated by the laser 101 in FIG. 1 into the microwave-power amplification laser induces period-one nonlinear dynamics showing completely different physical behaviors and characteristics.

Figure 4:
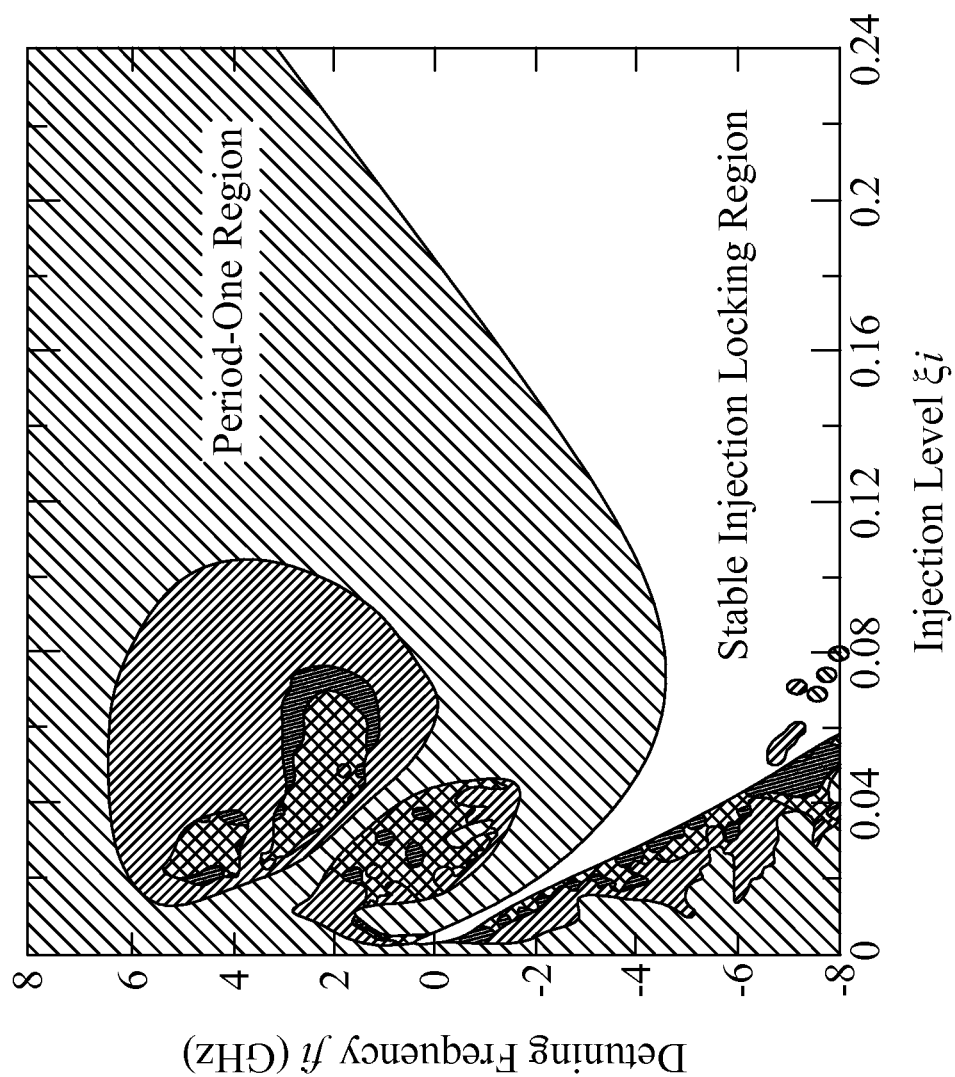
FIG. 4 shows a dynamical mapping of the microwave-power amplification laser subject to continuous-wave optical injection in terms of the injection level and the detuning frequency according to the preferred embodiment of the present invention.
Figure 5:
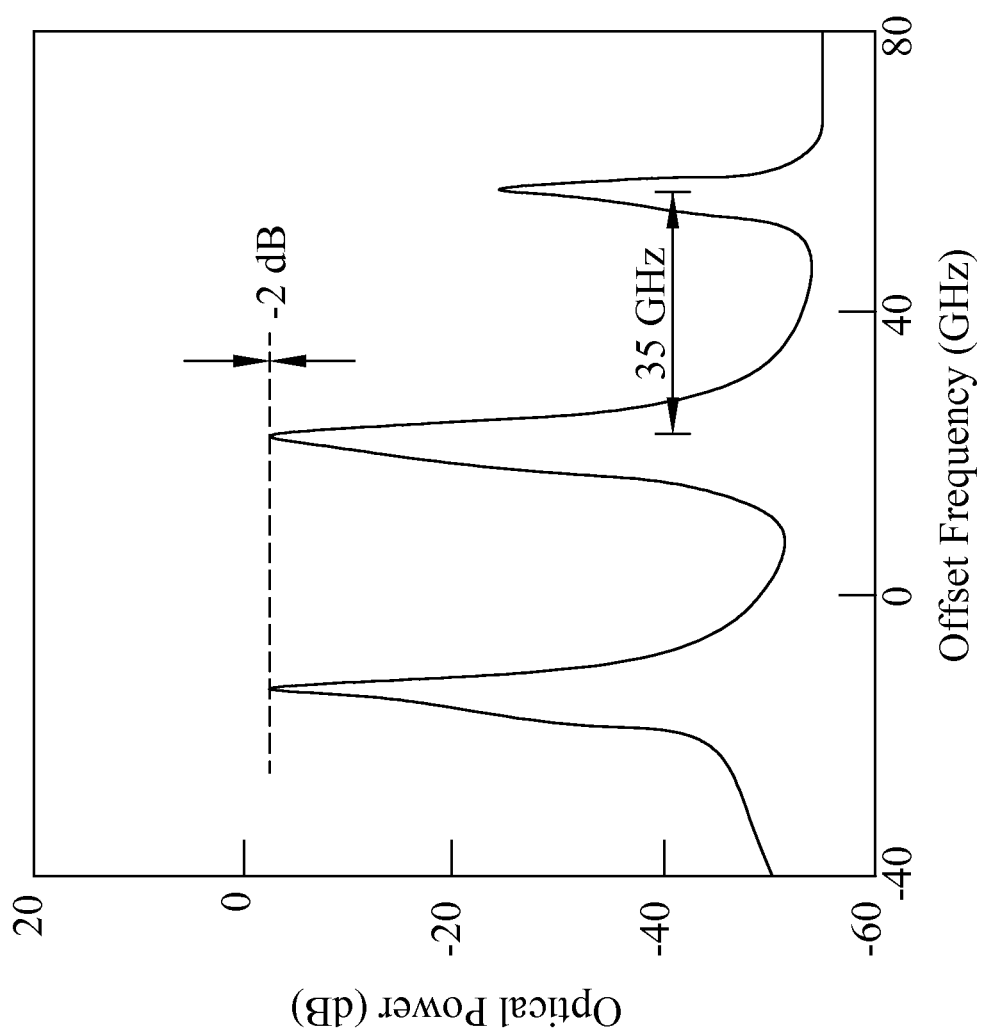
FIG. 5 shows an optical spectrum of the period-one nonlinear dynamics of the microwave-power amplification laser subject to continuous-wave optical injection according to the preferred embodiment of the present invention.

In the following explanations, the injection level, indicates the strength of the optical injection and the detuning frequency, $f_i$, indicates the frequency of the optical injection relative to the free-running frequency of the microwave-power amplification laser. Referring to FIGS. 4 and 5, FIG. 4 shows a dynamical mapping of the microwave-power amplification laser subject to continuous-wave optical injection in terms of the injection level and the detuning frequency according to the preferred embodiment of the present invention, and FIG. 5 shows an optical spectrum of the period-one nonlinear dynamics of the microwave-power amplification laser subject to continuous-wave optical injection according to the preferred embodiment of the present invention. FIG. 4 presents the region of the period-one nonlinear dynamics of the microwave-power amplification laser under different injection levels and detuning frequencies. When applying the microwave power amplification apparatus and method of the present invention, the injection level and detuning frequency of the optical input sent into the microwave power amplification module are chosen within the region of the period-one nonlinear dynamics in FIG. 4 where microwave power amplification can be achieved. In practical applications, the choice of the injection level and the detuning frequency can be determined based on the requirement of microwave power amplification. Under $\xi_i=1.1$ and $f_i=21$ GHz, FIG. 5 presents the optical spectrum of the microwave-power amplification laser subject to continuous-wave optical injection at the period-one nonlinear dynamics. In addition to the regeneration at $f_i=21$ GHz, two oscillation sidebands emerge, which are equally separated from the regeneration by $f_0=35$ GHz. Generally speaking, because of the red shift of laser cavity resonance, the power of the lower-frequency oscillation sideband is very close to that of the regeneration. In FIG. 5 of the present embodiment, the lower-frequency oscillation sideband is only 2 dB weaker than the regeneration. The microwave power amplification apparatus and method of the present invention take advantage of this characteristic to achieve microwave power amplification.

By adjusting $\xi_i$ or $f_i$ of the continuous-wave optical injection mentioned above, the frequency difference $f_0$ between adjacent frequency components and the power of each frequency component can be varied, resulting in different characteristics of the period-one nonlinear dynamics of the microwave power amplification laser. The injection level can be adjusted through the optical power adjuster, which may include an active optical device (typically an optical power amplifier) and a passive optical device (typically an optical power attenuator). However, if the injection level is high enough, only an optical power attenuator is required for the optical power adjustment. To effectively generate the period-one nonlinear dynamics, the polarization of the optical injection should align with that of the microwave-power amplification laser, which can be achieved through the optical polarization controller. In addition, to direct the optical injection and to minimize unnecessary back reflection, an optical circulator is adopted to unidirectionally direct the optical injection toward the microwave-power amplification laser and to unidirectionally direct the output of the microwave-power amplification laser toward an optical coupler (not shown). The optical coupler splits the output of the microwave-power amplification laser into two beams and sends these beams into the optical spectrum analyzer and the photodetector, respectively, for analysis.

Figure 6:
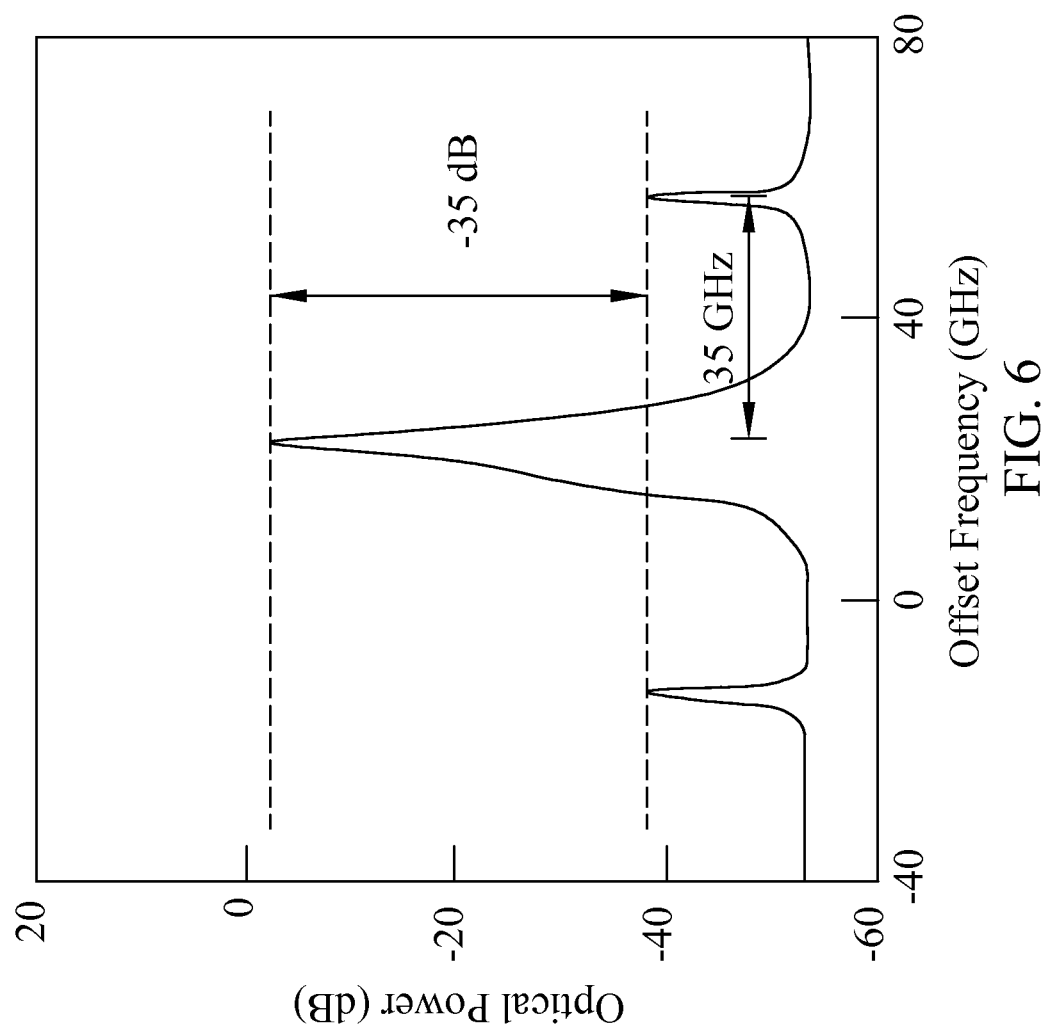
FIG. 6 shows an optical spectrum of the optical input carrying a power-to-be-amplified microwave signal according to the preferred embodiment of the present invention.
Figure 7:
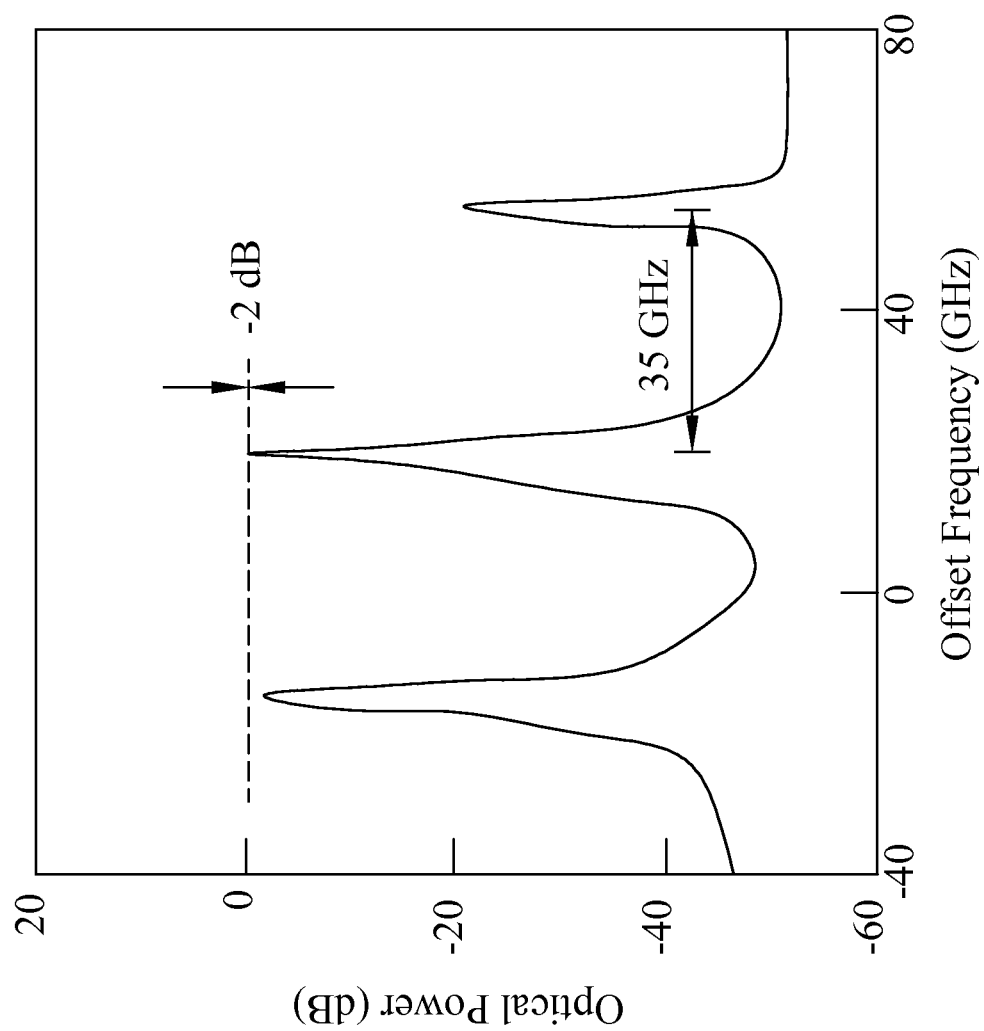
FIG. 7 shows an optical spectrum of the optical output carrying a power-amplified microwave signal according to the preferred embodiment of the present invention.
Figure 8:
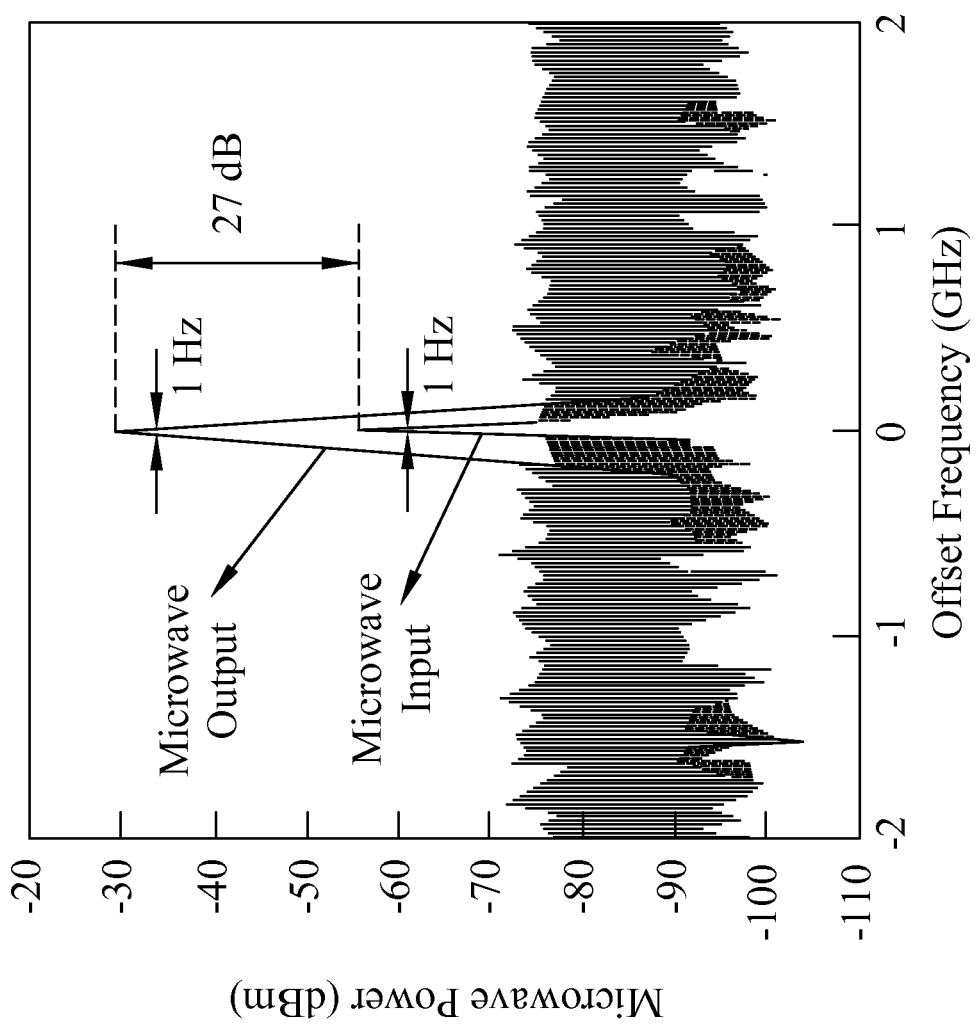
FIG. 8 shows microwave spectra of the optical input and the optical output, respectively, according to the preferred embodiment of the present invention.

Referring to FIG. 6, FIG. 6 shows an optical spectrum of the optical input carrying a power-to-be-amplified microwave signal according to the preferred embodiment of the present invention. By externally modulating the continuous-wave optical signal generated by the laser 101 in FIG. 1 at a microwave frequency of $f_m=35$ GHz, two modulation sidebands with equal optical power appear, as shown in FIG. 6, which are equally separated from the continuous-wave optical signal by $f_m=35$ GHz. The sideband-to-carrier ratio (SCR) of this optical input carrying a power-to-be-amplified microwave signal is 35 dB, corresponding to an optical modulation depth of about 3.6%. Referring to FIG. 7, FIG. 7 shows an optical spectrum of the optical output carrying a power-amplified microwave signal according to the preferred embodiment of the present invention. When the optical input carrying a power-to-be-amplified microwave signal is injected into the microwave-power amplification laser under the same $\xi_i$=1.1 and $f_i$=21 GHz, the power of the lower-frequency modulation sideband of the optical input is so considerably increased that SCR=−2 dB, as shown in FIG. 7, which results from the period-one nonlinear dynamics. Referring to FIG. 8, FIG. 8 shows microwave spectra of the optical input and the optical output, respectively, according to the preferred embodiment of the present invention. As shown in FIG. 8, the substantial enhancement of the optical modulation depth significantly amplifies the microwave power by 27 dB. In addition, the linewidth and phase noise of the microwave signal are similarly kept after microwave power amplification, which therefore greatly improves the signal-to-noise ratio and which in turn significantly enhances the detection sensitivity and the transmission distance.

By adjusting $\xi_i$ and $f_i$, the frequency difference $f_0$ between adjacent frequency components and the power of each frequency component in FIG. 5 can be varied, resulting in different characteristics of the period-one nonlinear dynamics of the microwave power amplification laser. Therefore, this feature can be utilized to adjust the microwave gain of a microwave signal, or to achieve the same microwave gain for microwave signals of different frequencies. More discussion on this feature will be provided below.

Figure 9:
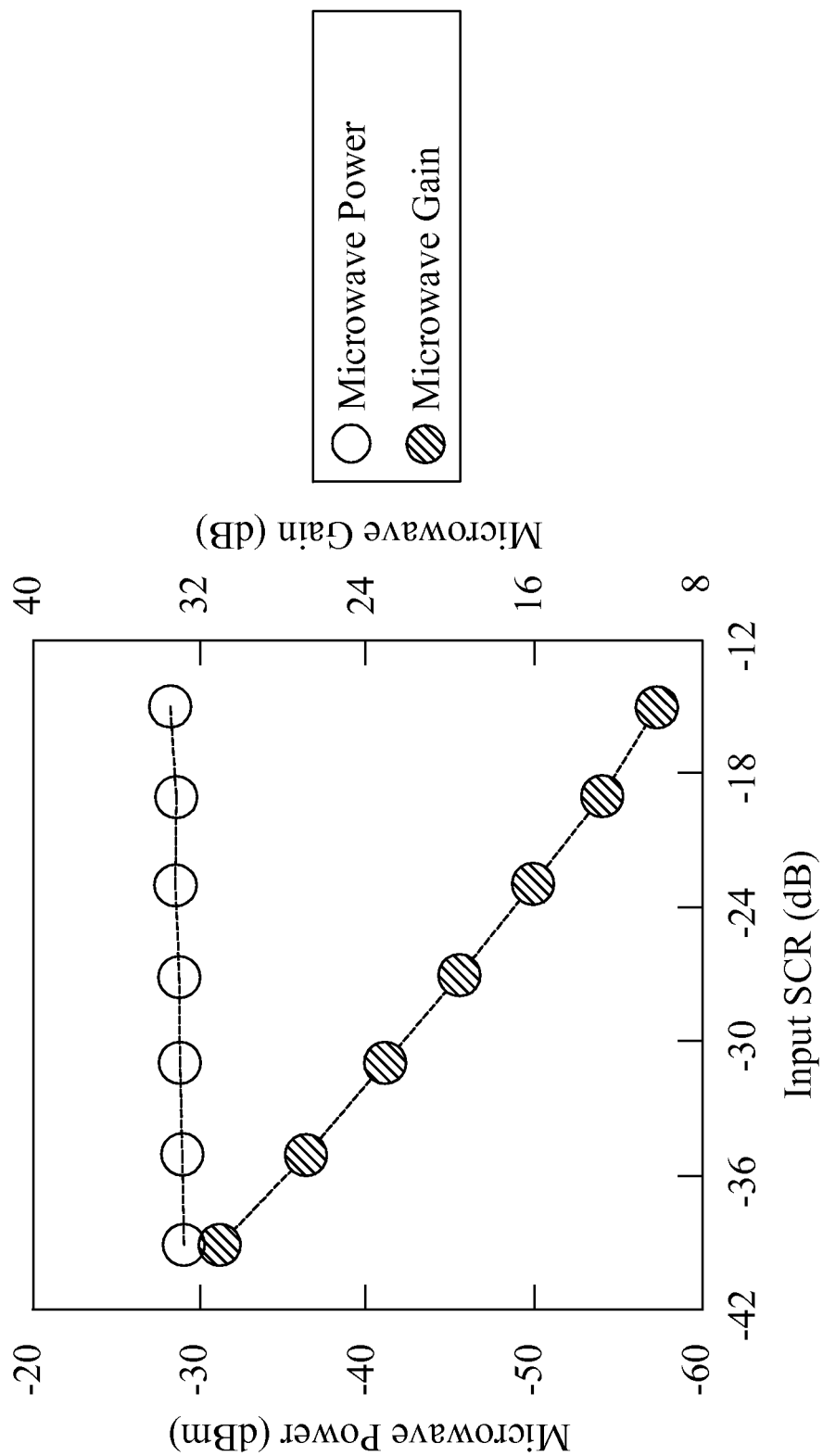
FIG. 9 shows microwave power and microwave gain in terms of the input sideband-to-carrier ratio (SCR) after microwave power amplification according to the preferred embodiment of the present invention.

Referring to FIG. 9, FIG. 9 shows microwave power and microwave gain in terms of the input sideband-to-carrier ratio (SCR) after microwave power amplification according to the preferred embodiment of the present invention. Under the same $\xi_i$=1.1, $f_i$=21 GHz, and $f_m$=35 GHz, the characteristics of the period-one nonlinear dynamics in the microwave-power amplification laser are the same. Accordingly, as shown in FIG. 9, the same output microwave power is obtained for different values of input SCR, leading to a reducing microwave gain as the input microwave power increases.

Figure 10:
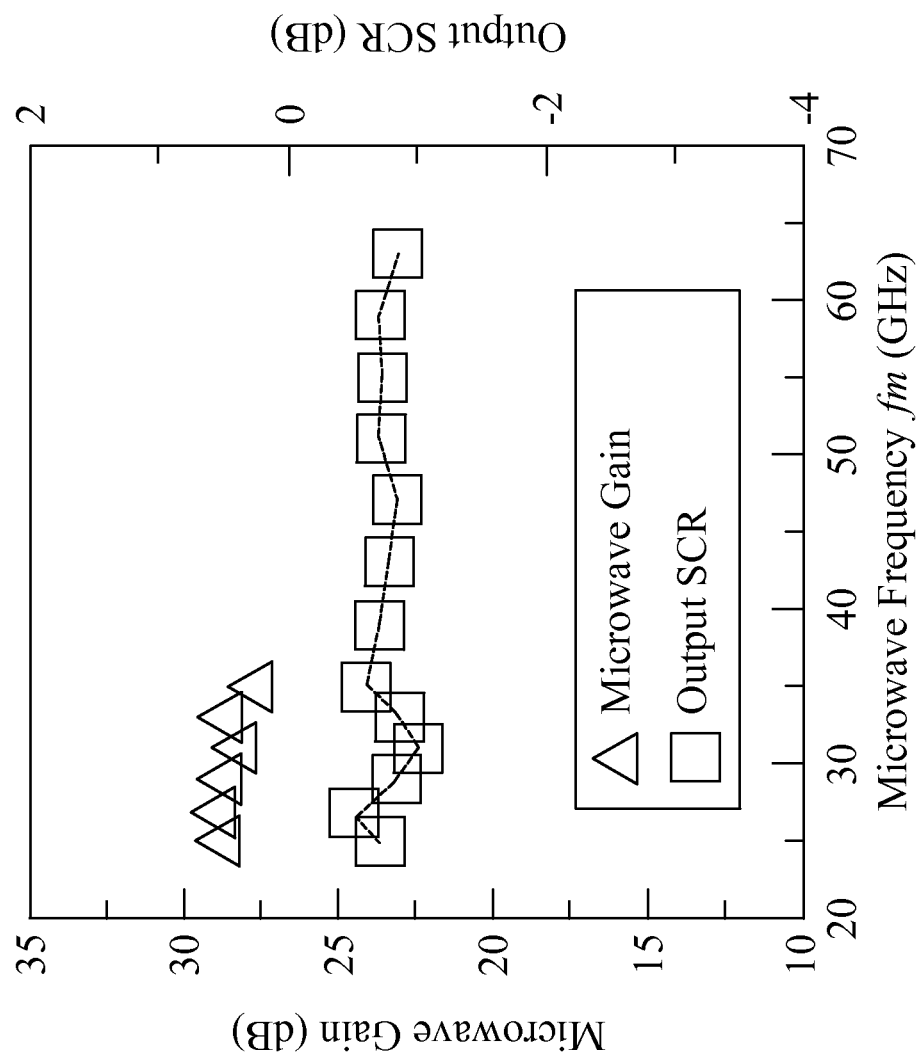
FIG. 10 shows microwave gain and output sideband-to-carrier ratio (SCR) in terms of the microwave frequency after microwave power amplification according to the preferred embodiment of the present invention.

Referring to FIG. 10, FIG. 10 shows microwave gain and output sideband-to-carrier ratio (SCR) in terms of the microwave frequency after microwave power amplification according to the preferred embodiment of the present invention. Different characteristics of the period-one nonlinear dynamics can result in different $f_0$ but a same output SCR value, which can be used to obtain a same microwave gain for input microwave signals of different frequencies. As shown in FIG. 10, a set of different characteristics of the period-one nonlinear dynamics is so obtained for $f_m$ ranging from 25 to 35 GHz that the output SCR of these microwave signals is around −0.8 dB, leading to the same microwave gain of 29 dB. It can be observed in FIG. 10 that the output SCR is also around −0.8 dB for $f_m$=35 to 63 GHz, suggesting that the same microwave gain of 29 dB can also be achieved for these microwave signals.

Figure 11:
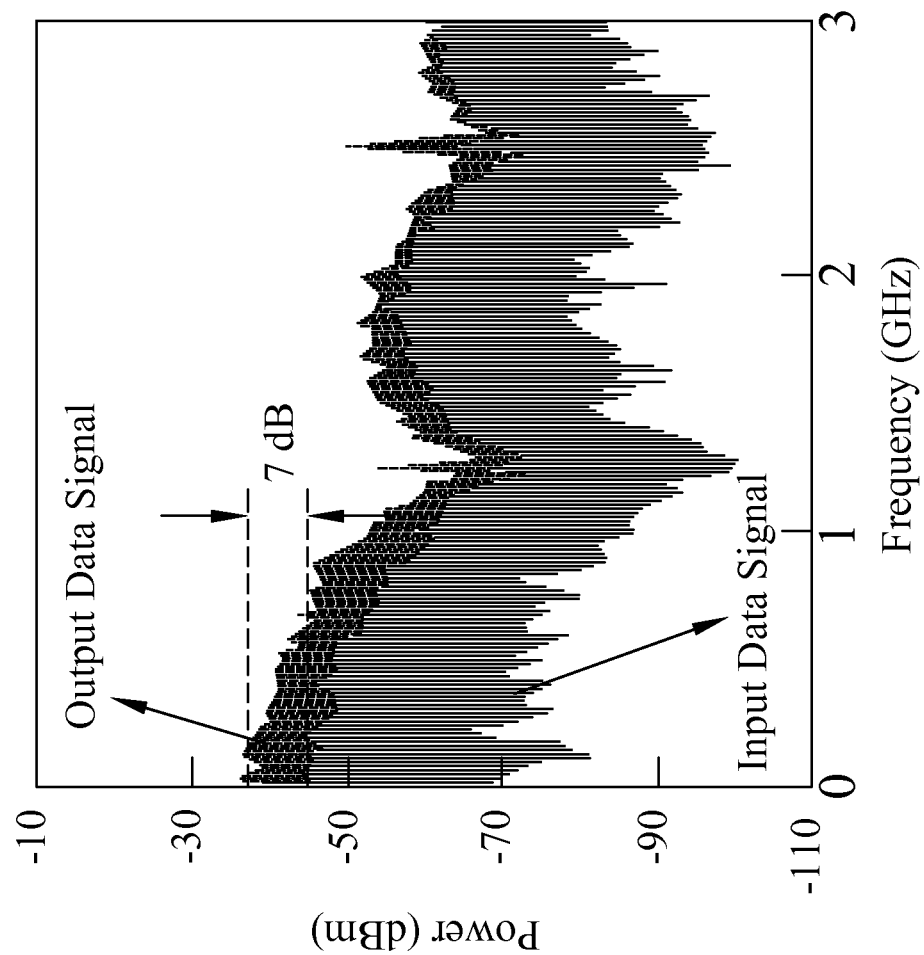
FIG. 11 shows spectra of the input data signal and the output data signal, respectively, according to the preferred embodiment of the present invention.
Figure 12:
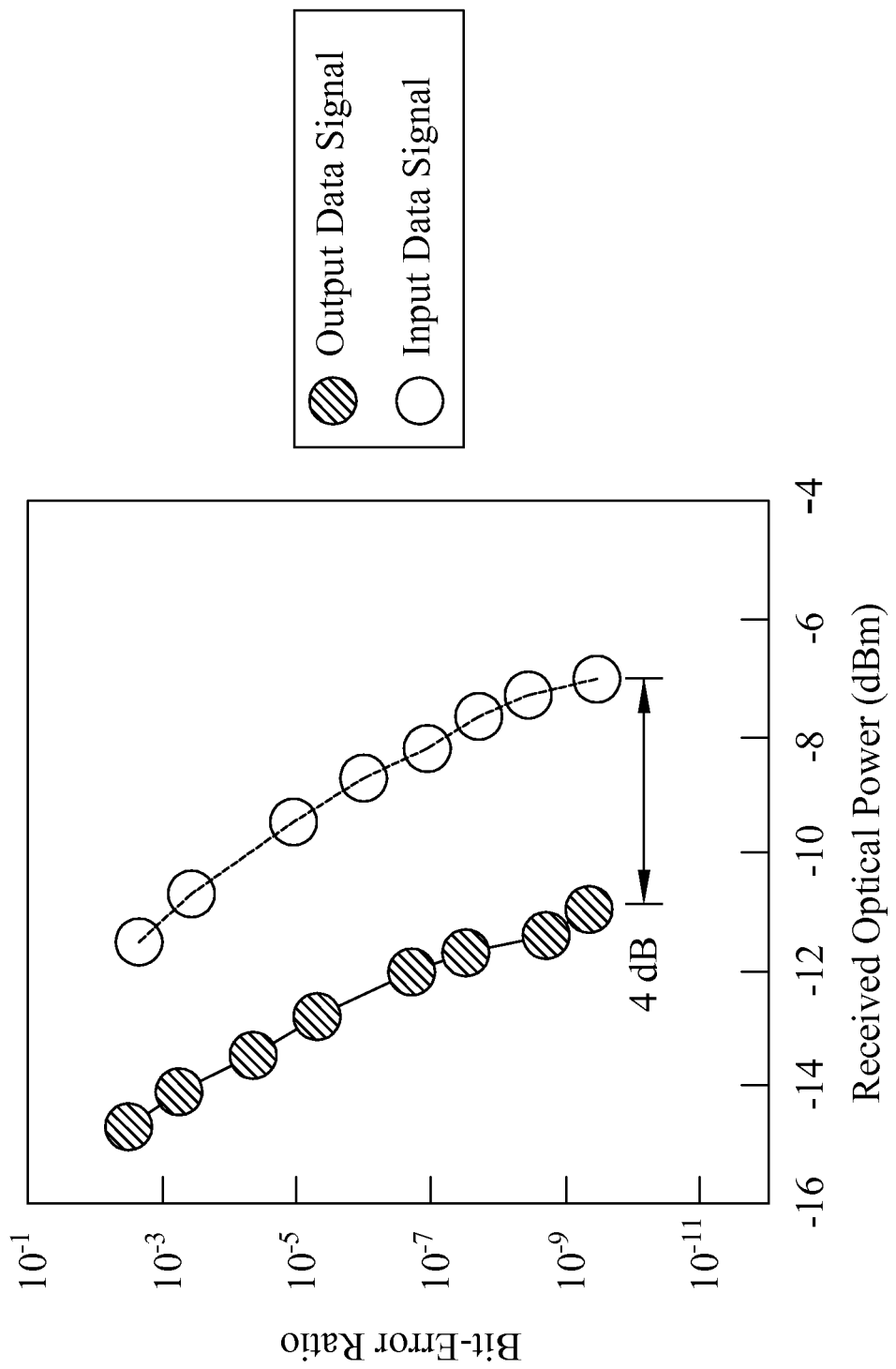
FIG. 12 shows bit-error ratios (BERs) of the input data signal and output data signal, respectively, in terms of the received optical power according to the preferred embodiment of the present invention.
Figure 13:
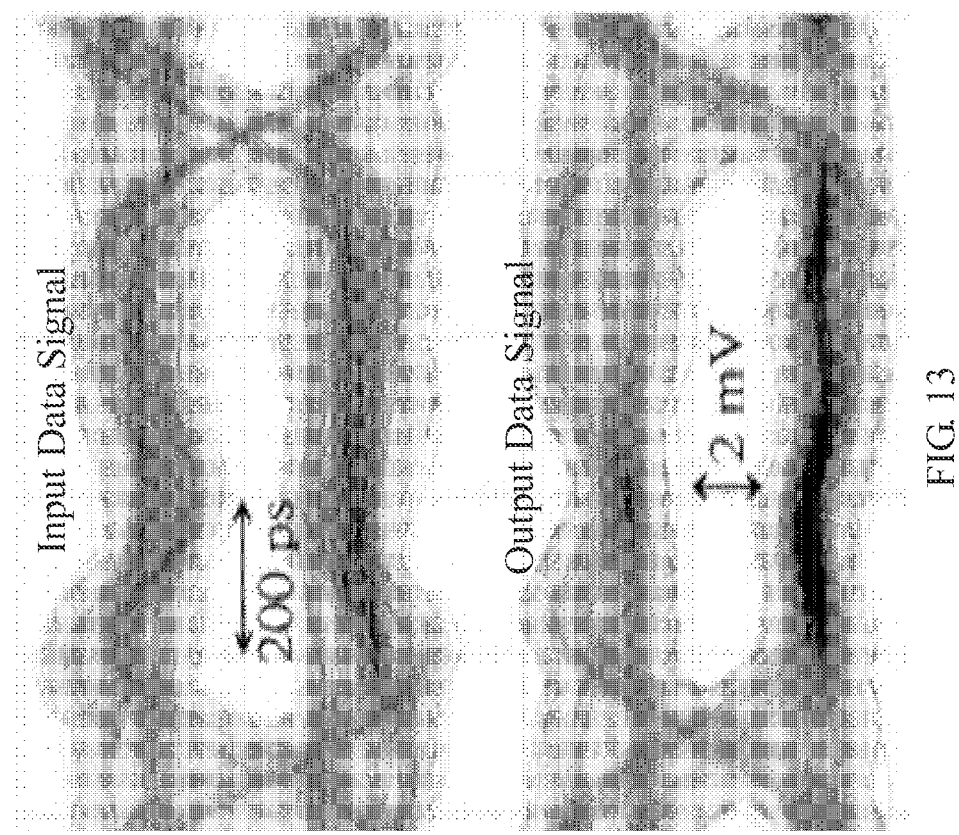
FIG. 13 shows eye diagrams of the input data signal and the output data signal, respectively, according to the preferred embodiment of the present invention.

Referring to FIG. 11, FIG. 12, and FIG. 13, FIG. 11 shows spectra of the input data signal and the output data signal, respectively, according to the preferred embodiment of the present invention, FIG. 12 shows bit-error ratios (BERs) of the input data signal and output data signal, respectively, in terms of the received optical power according to the preferred embodiment of the present invention, and FIG. 13 shows eye diagrams of the input data signal and the output data signal, respectively, according to the preferred embodiment of the present invention. To investigate whether the aforementioned microwave power amplification leads to the performance improvement of the communication networks, analyzing the quality of the data signal carried by the microwave signal before and after microwave power amplification is conducted. First, as shown in FIG. 11, while the power of the microwave signal is enhanced by 10 dB, that of the data signal (at a bit rate of 1.25 Gb/s) carried by the microwave signal (at $f_m$=35 GHz) is similarly increased by about 7 dB. Since the frequency range of the power-amplified data signal is on the order of GHz, the microwave power amplification apparatus and method of the present invention can be applied to the RoF networks with a data rate of at least several Gb/s. Second, as shown in FIG. 12, the bit-error ratio (BER) analysis of the data signal shows that, after microwave power amplification, not only a similar BER behavior is obtained as a function of the received optical power but also a lower received optical power (about 4 dB lower) is necessary to achieve a typically required BER of $10^{-9}$. This indicates that the data detection sensitivity is enhanced, and that the transmission distance and efficiency are also similar improved. The result of FIG. 13 suggests that, in the above embodiment, the adequate power difference between the binary data for high bit rates ensures correct retrieval of the data signal to be transmitted.

Refer to FIG. 5 to FIG. 13. At the period-one nonlinear dynamics, FIG. 5 shows that the power of the lower-frequency oscillation sideband is close to that of the regeneration, which is only 2 dB weaker in the present embodiment. The microwave power amplification apparatus and method of the present invention take advantage of this characteristic to achieve microwave power amplification. The optical input carrying the power-to-be-amplified microwave signal shown in FIG. 6 is a typical optical double-sideband modulation signal, and FIG. 7 to FIG. 13 demonstrate the results and analyses of the optical double-sideband modulation signal after microwave power amplification using the period-one nonlinear dynamics. Since similar processes and results of the aforementioned microwave power amplification are observed for an optical input that is an optical single-sideband modulation signal, no matter whether it exhibits a lower- or higher-frequency modulation sideband, they will not be repeated.

It should be understood that the present invention is not limited to the details thereof. Various equivalent variations and modifications may still occur to those skilled in this art in view of the teachings of the present invention. Thus, all such variations and equivalent modifications are also embraced within the scope of the present invention as defined in the appended claims.

What is claimed is:

1. A microwave power amplification apparatus, comprising:
   an optical input, wherein the optical input is an optical signal carrying a power-to-be-amplified microwave signal and the optical input has at least one modulation sideband;
   an optical output, wherein the optical output is an optical signal carrying a power-amplified microwave signal; and
   a microwave power amplification module comprising a microwave-power amplification laser to convert the optical input into the optical output using period-one nonlinear dynamics of the microwave-power amplification laser, wherein a typical output of the microwave-power amplification laser without the optical input is a continuous wave of one single frequency, and wherein an optical power and a carrier frequency of the optical input are adjusted so as to place the microwave-power amplification laser in the period-one nonlinear dynamics.

2. The microwave power amplification apparatus of claim 1, further comprising a microwave-modulated optical signal generation module to generate the optical input, wherein the microwave-modulated optical signal generation module comprises:
    a laser to generate a continuous-wave optical signal;
    an optical polarization controller to adjust the polarization of the continuous-wave optical signal;
    a microwave signal generator to generate the power-to-be-amplified microwave signal; and
    an external modulator to superimpose the power-to-be-amplified microwave signal on the continuous-wave optical signal to generate the optical input.

3. The microwave power amplification apparatus of claim 2, wherein the microwave-modulated optical signal generation module further comprises:
    a data signal generator to generate a data signal to be transmitted, and the data signal being an analog signal or a digital signal; and
    an electrical signal mixer to mix the power-to-be-amplified microwave signal with the data signal to generate a power-to-be-amplified microwave signal carrying the data signal.

4. The microwave power amplification apparatus of claim 1, wherein the microwave power amplification module further comprises:
    an optical power adjuster, comprising an active optical device or a passive optical device, to adjust the optical power of the optical input; and
    an optical polarization controller to adjust the polarization of the optical input.

5. The microwave power amplification apparatus of claim 4, wherein the active optical device is an optical power amplifier and the passive optical device is an optical power attenuator.

6. The microwave power amplification apparatus of claim 1, wherein the microwave power amplification module further comprises an optical path controller, connected to the microwave-power amplification laser, to unidirectionally direct the optical input toward the microwave-power amplification laser, and to unidirectionally direct the optical output toward an output port of the microwave power amplification apparatus.

7. The microwave power amplification apparatus of claim 6, wherein the optical path controller is an optical circulator and the microwave-power amplification laser is a semiconductor laser.

8. A microwave power amplification method, comprising steps of:
    using a microwave-modulated optical signal generation module to generate an optical input, wherein the optical input is an optical signal carrying a power-to-be-amplified microwave signal and the optical input has at least one modulation sideband; and
    a microwave-power amplification laser to convert the optical input into an optical output using period-one nonlinear dynamics of the microwave-power amplification laser, wherein the optical output is an optical signal carrying a power-amplified microwave signal, wherein a typical output of the microwave-power amplification laser without the optical input is a continuous wave of one single frequency, and wherein an optical power and a carrier frequency of the optical input are adjusted so as to place the microwave-power amplification laser in the period-one nonlinear dynamics.

9. The microwave power amplification method of claim 8, wherein the step of using the microwave-modulated optical signal generation module to generate the optical input comprises steps of:
    using a laser to generate a continuous-wave optical signal;
    using an optical polarization controller to adjust the polarization of the continuous-wave optical signal;
    using a microwave signal generator to generate the power-to-be-amplified microwave signal; and
    using an external modulator to superimpose the power-to-be-amplified microwave signal on the continuous-wave optical signal to generate the optical input.

10. The microwave power amplification method of claim 9, further comprising steps between the step of using the microwave signal generator to generate the power-to-be-amplified microwave signal and the step of using the external modulator to superimpose the power-to-be-amplified microwave signal on the continuous-wave optical signal to generate the optical input of:
    using a data signal generator to generate a data signal to be transmitted, and the data signal being either an analog signal or a digital signal; and
    using an electrical signal mixer to mix the power-to-be-amplified microwave signal with the data signal to generate a power-to-be-amplified microwave signal carrying the data signal.

11. The microwave power amplification method of claim 8, further comprising steps between the step of using the microwave-modulated optical signal generation module to generate the optical input and the step of using the microwave-power amplification laser to convert the optical input into the optical output of:
    using an optical power adjuster to adjust the optical power of the optical input; and
    using an optical polarization controller to adjust the polarization of the optical input.

12. The microwave power amplification method of claim 8, wherein the step of using the microwave-power amplification laser to convert the optical input into the optical output further comprises:
    using an optical path controller to unidirectionally direct the optical input toward the microwave-power amplification laser, and to unidirectionally direct the optical output toward an output port.

\* \* \* \* \*